United States Patent [19]
Ryoji et al.

[11] Patent Number: 5,942,854
[45] Date of Patent: Aug. 24, 1999

[54] ELECTRON-BEAM EXCITED PLASMA GENERATOR WITH SIDE ORIFICES IN THE DISCHARGE CHAMBER

[75] Inventors: Makoto Ryoji, Kitasouma-gun; Masakuni Tokai, Noda; Yukitaka Mori, Noda; Takeshi Hasegawa, Noda; Masahito Ban, Noda, all of Japan

[73] Assignee: Kawasaki Jukogyo Kabushiki Kaisha, Kobe, Japan

[21] Appl. No.: 09/090,402

[22] Filed: Jun. 4, 1998

[30] Foreign Application Priority Data

Jun. 11, 1997 [JP] Japan ................................. 9-169453
Mar. 26, 1998 [JP] Japan ................................. 10-098527

[51] Int. Cl.$^6$ .............................. H01J 27/02; H05H 1/24
[52] U.S. Cl. ............................ 315/111.21; 315/111.71; 118/723 HC; 313/231.31
[58] Field of Search ................ 315/111.21, 111.31, 315/111.71; 250/426, 427; 118/723 HC; 156/345 P; 313/231.31

[56] References Cited

U.S. PATENT DOCUMENTS 5,097,179 3/1992 Takayama ................. 315/111.21 X
5,384,018 1/1995 Ramm et al. ............. 118/723 HC X Primary Examiner—Benny Lee
Assistant Examiner—Justin P. Bettendorf
Attorney, Agent, or Firm—Oliff & Berridge, PLC

[57] ABSTRACT

The present invention provides an electron-beam excited plasma generator which can effectively form samples of larger areas.

The electron-beam excited plasma generator according to the present invention comprises a cathode (11) for emitting thermions; a discharge electrode (23) for gas discharge between the cathode and the same; an intermediate electrode (13) positioned coaxially with the discharge electrode in an axial direction; a discharge chamber (2) to be filled with discharge gas plasma generated by the gas discharge between the cathode and the discharge electrode; a plasma processing chamber (3) formed adjacent to the discharge chamber with a partition wall (21) disposed therebetween and positioned so that a surface-to-be-processed of a workpiece-to-be-processed (35) is positioned perpendicular to the axial direction; a plurality of orifices (22) for pulling out electrons in the discharge gas plasma in the discharge chamber into the plasma processing chamber, each being formed in the partition wall substantially perpendicular to the axial line and distributed radially with respect to the axial direction; and an accelerating electrode (31) disposed in the plasma processing chamber for pulling out and accelerating the electrons through the orifices.

21 Claims, 12 Drawing Sheets

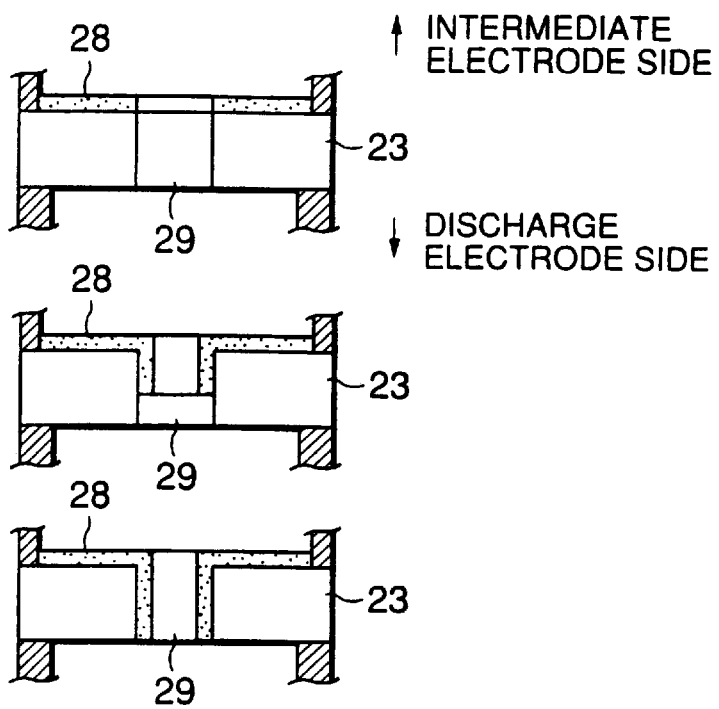
FIG.9 (a)
FIG.9 (b)
FIG.9 (c)
↑ INTERMEDIATE ELECTRODE SIDE
↓ DISCHARGE ELECTRODE SIDE
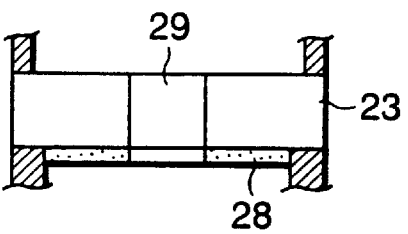
FIG.10 (a)
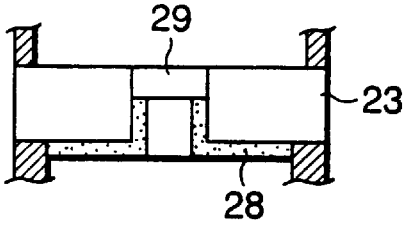
FIG.10 (b)
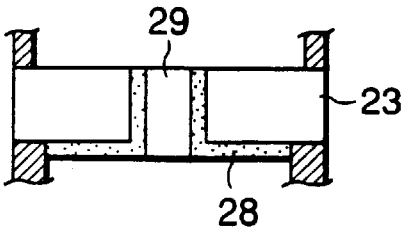
FIG.10 (c)

ELECTRON-BEAM EXCITED PLASMA GENERATOR WITH SIDE ORIFICES IN THE DISCHARGE CHAMBER

BACKGROUND OF THE INVENTION

1. Field of the Invention

The present invention relates to an electron-beam excited plasma generator and, more specifically, to the construction of an orifice through which electrons are pulled out from a discharge chamber of an electron beam generator.

2. Description of the Related Art

Electron-beam excited plasma processing systems are used widely as plasma processing systems including plasma ion plating systems, plasma CVD systems, plasma sputtering systems and plasma etching systems for film deposition, etching and surface modification. An electron-beam excited plasma processing system comprises an electron beam generator which generates an electron beam, and a plasma processing unit having a plasma processing chamber in which a plasma is produced by ionizing a gas by the electron beam to achieve various reactions therein.

The electron beam generator has a cathode, an intermediate electrode, a discharge electrode and an accelerating electrode arranged in that order. When a discharge voltage is applied across the cathode and the discharge electrode, the cathode emits thermions. The thermions convert a gas supplied to the cathode into a plasma. The plasma fills up a discharge chamber between the intermediate electrode and the discharge electrode. When an accelerating voltage is applied across the discharge electrode and the accelerating electrode, electrons are extracted from the plasma and pulled out through an orifice formed in a central part of the discharge electrode, the electrons are accelerated, and an electron beam of a high current is supplied to the plasma processing chamber. The electron beam ionizes or dissociates a process gas supplied into the plama processing chamber into a plasma for processing a wafer.

FIG. 19 is a typical sectional view of a conventional electron-beam excited plasma processing system of a perpendicular beam projection type. A cathode 101, an intermediate electrode 102 and a discharge electrode 103 are disposed coaxially. The discharge electrode 103 is provided in its central part with an orifice 104. An inert gas for producing a plasma, such as argon (Ar) gas, is supplied into a cathode chamber and is ionized into a plasma by a discharge voltage across the cathode 101 and the discharge electrode 103.

A plasma processing vessel 106 has walls made of a conductive material and defines a plasma processing chamber 113. An accelerating voltage is applied to the plasma processing vessel 106 to pull out an electron beam of a high current through the orifice 104 from the plasma produced in a discharge chamber 112. A process gas suitable for a desired reaction to be achieved in the plasma processing chamber 113, such as silane gas or methane gas, is suppplied into the plasma processing chamber 113, the process gas is ionized or dissociated into a plasma by the electron beam. Radicals thus produced are deposited on a workpiece 107, such as a wafer, or ions of the plasma are implanted perpendicularly into the workpiece 107 by the agency of the difference between the potential of the plasma and the surface potential of the workpiece 107.

A pair of solenoids 108 are disposed coaxially so as to surround the orifice 104 of the discharge electrode 103. Currents are supplied in opposite directions to the pair of solenoids 108, respectively. The electron beam 105 traveling through the orifice 104 is constricted by the agency of the inner solenoid 108a to reduce the diameter thereof. A magnetic field created apart from the discharge electrode 103 is cancelled by the agency of the pair of solenoids 108 to spread the plasma throughout the processing chamber 113. The side walls of the plasma processing vessel 106 is protected by a quartz bell jar 109. The bell jar 109 suppresses the deposition of substances on the side walls and can be easily cleared of deposits.

Ar gas supplied into the cathode chamber 111 flows into the plasma processing chamber 113 according to a pressure gradient and is discharged together with the process gas. The workpiece 107 to be processed, is disposed in alignment with the axis of the electron beam 105. A RF bias voltage is applied to a support table 110 holding the workpiece 107 to control sheath ion energy on the surface of the workpiece 107. Water is circulated through the support table 110 to cool the same.

FIGS. 20(a) and 20(b) are graphs representing the condition of the plasma processing chamber 113 in operation. FIG. 20(a) is a graph showing the distribution of surface potential on the workpiece 107, in which distance from the axis of the electron beam 105 is measured on the horizontal axis, surface potential is measured on the vertical axis, curves Vf represent surface potential distributions for different gas pressures in the plasma processing chamber 113 and a curve Vs represents the distribution of plasma potential in the neighborhood of the surface of the workpiece 107. FIG. 20 (b) is a graph showing the distribution of plasma density in the neighborhood of the surface of the workpiece 107, in which distance from the axis of the electron beam 105 is measured on the horizontal axis and plasma density is measured on the vertical axis.

In this conventional electron-beam excited plasma processing system, electrons of the electron beam 105 are accelerated in a direction perpendicular to the surface of the workpiece 107 and the electron beam 105 is projected into the plasma processing chamber 113 and, therefore, high-energy electrons of the electron beam 105 impinge directly on the workpiece 107 if the gas pressure in the plasma processing chamber 113 is low. Consequently, a middle part of the curve Vf indicating the distribution of floating potential sinks deep as shown in FIG. 20(a), and the sheath voltage on the surface of the workpiece 107, i.e., the difference between the plasma potential indicated by the curve Vs and the floating potential indicated by the curve Vf increases. Accordingly, in some types of processes, the surface of the workpiece 107 is damaged by a physical etching action or an intense ion bombardment and the surface of the workpiece 107 cannot satisfactorily processed.

As shown in FIG. 20(a), the floating potential is distributed on the surface of the workpiece 107 in the upward concave curve Vf indicating that the surface potential decreases toward the central part of the surface of the workpiece 107. A potential distribution on the back surface of the workpiece 107 is flat and is the average of the potential of the front surface. Therefore there is a great difference between the potential difference between the surface and the back surface of the workpiece 107 in a central part of the workpiece 107 and that in a peripheral part of the workpiece 107, which, when etching, for example, a gate oxide film for a DRAM, deteriorates or breaks the gate oxide film. Such a trouble can be avoided by increasing the gas pressure in the processing chamber 113 to increase the frequency of collision between the electrons and the molecules of the process gas or by increasing the distance between the orifice 104 and the workpiece 107 to make high-energy electrons fall on the surface of the workpiece 107 after the energy thereof has been reduced. However, if the gas pressure is increased, the energy of electrons decreases sharply with distance from the axis of the electron beam 105 and, consequently, the plasma density increases toward the axis of the electron beam 105 as shown in FIG. 20(b), which affects adversely to the uniformity of plasma processing on the surface of the workpiece 107. Increase in the distance between the orifice 104 and the workpiece 107 is not preferable because the increase in the distance between the orifice 104 and the workpiece 107 entails increase in the size of the system.

FIG. 21 is a diagrammatic view of an electron-beam excited plasma processing system proposed by the applicant of the present patent application in Japanese Patent Application No. 8-68711. This electron-beam excited plasma processing system is of a parallel beam projection type which projects an electron beam and accelerates the electrons of the electron beam in a direction parallel to the surface of a workpiece 201 so that the high-energy electrons may not impinge directly on the surface of the workpiece 201. A cathode 202, an auxiliary electrode 203, a discharge electrode 204 and an accelerating electrodes 205 are disposed coaxially. The electrodes 203, 204 and 205 are provided in their central parts with orifices, respectively.

A gas to be ionized to produce a plasma, such as Ar gas, is supplied into a discharge region 206 and a voltage is applied across the cathode 202, the auxiliary electrode 203 and the discharge electrode 204 by a discharge power supply 208 to ionize the gas, such as Ar gas, and to maintain stabilized discharge. An acceleration power supply 209 applies an accelerating voltage to the acceleration electrode 205 to pull out an electron beam of a high current from the Ar plasma produced in the discharge region 206 into an accelerating region 207. The electron beam travels through the orifice of the accelerating electrode 205 into a plasma processing chamber 210, in which the electron beam dissociates and ionizes a process gas, such as silane gas or methane gas, supplied into the plasma processing chamber 210 to produce a plasma, in the plasma processing chamber 210.

FIGS. 22(a) and 22(b) are graphs representing the condition of the plasma processing chamber 210 in operation. FIG. 22(a) is a graph showing the distribution of surface potential on a workpiece 201, in which distance from the accelerating electrode 205 is measured on the horizontal axis and surface potential is measured on the vertical axis. In FIG. 22(a), a curve B—B represent surface potential distribution in the case of placing the workpiece 201 in a plane B—B in FIG. 21. FIG. 22(b) is a graph showing the distributions of plasma density in the plane B—B (FIG. 21) in the neighborhood of the surface of the workpiece 201 and in a plane A—A (FIG. 21) in the neighborhood of the axis of the electron beam. In FIG. 22(b), distance from the accelerating electrode 205 is measured on the horizontal axis and plasma density is measured on the vertical axis.

The workpiece 201 is supported on a table in the plasma processing chamber 210 with its surface extended in parallel to the axis of the electron beam. Since parts of the electron beam nearer to the accelerating electrode 205 contain more high-energy electrons than parts of the same farther from the accelerating electrode 205, the potentials of parts of the surface of the workpiece 201 nearer to the accelerating electrode 205 are slightly lower than those of parts of the same farther from the accelerating electrode 205. Since the high-energy electrons of the electron beam do not impinge directly on the surface of the workpiece 201, the distribution of floating potnetial on the surface of the workpiece 201 is indicated by a substantially flat curve not having a deeply sunk section, which is different from the curves shown in FIG. 20(a). On the other hand, the density of plasma decreases with distance from the accelerating electrode 205 along the axis of the electron beam as shown in FIG. 22(b). Consequently, when depositing a film on the workpiece, a material for forming the film is deposited at different deposition rates in parts of the surface of the workpiece 201 nearer to the accelerating electrode 205 and parts of the same farther from the accelerating electrode 205, respectively, and a film of an uniform quality cannot be formed. Such a problem is particularly significant when processing a workpiece of a large area.

In either the electron-beam excited plasma processing system shown in FIG. 19 or the electron-beam excited plasma processing system shown in FIG. 21, only electrons which can be ionized in the orifice can be supplied, and there is a limit to the increase of plasma density when electrons are supplied into the plasma processing chamber through a single orifice.

Accordingly, it is an object of the present invention to solve the foregoing problems in the prior art and to provide an electron-beam excited plasma processing system capable of moderating the physical etching action and impacting action of ions, of properly processing workpieces having a large area, and of producing a plasma in a high plasma density and in a uniform plasma density distribution for the efficient processing of workpieces.

SUMMARY OF THE INVENTION

To solve the above-described problems the electron-beam excited plasma generator according to the present invention comprises a cathode for emitting thermions; a discharge electrode for gas discharge between the cathode and the same; an intermediate electrode positioned coaxially with the discharge electrode in an axial direction; a discharge chamber to be filled with discharge gas plasma generated by the gas discharge between the cathode and the discharge electrode; a plasma processing chamber formed adjacent to the discharge chamber with a partition wall disposed therebetween and positioned so that a surface-to-be-processed of a workpiece-to-be-processed is positioned perpendicular to the axial direction; a plurality of orifices for pulling out electrons in the discharge gas plasma in the discharge chamber into the plasma processing chamber, each being formed in the partition wall substantially perpendicular to the axial line and distributed radially with respect to the axial direction; and an accelerating electrode disposed in the plasma processing chamber for pulling out and accelerating the electrons through the orifices.

In the above-described invention, a plurality of orifices are formed in the partition wall separating the discharge chamber and the plasma process chamber substantially perpendicularly to the axial line of the discharge electrode and the intermediate electrode and distributed radially with respect to the axial line, whereby electrons in a discharge gas plasma in the discharge chamber are pulled out into the plasma processing chamber substantially perpendicularly to the axial line through the orifices to form electron beams flowing substantially perpendicularly to the axis line. On the other hand, the surface-to-be-processed of a workpiece is positioned in the plasma processing chamber perpendicular to the axial line. Accordingly the electron beams pulled out through the orifices are never implanted perpendicularly in the surface-to-be-processed of the workpiece, high-energy components of the electron beams rare impinge directly on the surface-to-be-processed of the workpiece. No drop of a floating voltage in the surface-to-be-processed of the workpiece takes place, and risks of damaging the surface-to-be-processed of the workpiece by physical etching or ion bombardment can be removed, and workpieces of large areas can be homogeneously processed.

Because of a plurality of orifices formed in the partition wall, a larger number of electrons can be pulled out through the orifices in comparison with the conventional generator including a single orifice. Higher plasma densities can be obtained in the plasma processing chamber.

The plural orifices are formed radially with respect to the axial line, and a dense plasma distributed in a ring is produced, which can improve distribution uniformity of the plasma and permits large-area workpieces to be processed.

It is possible that the partition wall is formed of a conductor and also functions as the discharge electrode, whereby the parts where the orifices are formed permit to function as the discharge electrode, and electron beams can be very efficiently pulled out from a plasma (discharge gas plasma) in the discharge chamber.

In a case that the parts where the orifices are the discharge electrode, the surfaces of the pull-out orifices on the side of the plasma processing chamber are coated with an insulating material. The surfaces of the orifices are coated with an insulating material. The coating of an insulating material mitigates a voltage gradient between a plasma in the plasma processing chamber and the discharge electrode and protects the surfaces, whereby high-energy ions can be prohibited from impinging on the discharge electrode to thereby cause damages or to contaminate the plasma with an electrode material.

It is possible that the discharge chamber is formed between the intermediate electrode and the discharge electrode, whereby the generator can be compact.

It is possible that the discharge chamber is formed below both the intermediate electrode and the discharge electrode, and the discharge chamber is formed between the discharge electrode and the orifices, whereby spattering on the discharge electrode by ions in a plasma generated in the space of the discharge chamber is prevented to thereby depress generation of contamination and abrasion of the discharge electrode.

The surface of the discharge electrode on the side of the intermediate electrode is coated with an insulating material, whereby loss current which is that of the electron beams from the cathode, which does not pass through the space of the discharge chamber can be depressed to thereby a larger number of electrons can be pulled out into the plasma chamber.

The surface of the discharge electrode on the side of the orifices is coated with an insulating material, whereby abrasion of the discharge electrode by spattering by ions generated in the space of the discharge chamber can be better prevented.

The wall of the plasma processing chamber also functions as the accelerating electrode, whereby a plasma of a material gas can be uniformly distributed widely generally in the plasma processing chamber, and a plasma density distribution on a surface-to-be-processed of a workpiece can be uniform. Homogeneous processing is enabled.

A single coil for generating a magnetic field is disposed coaxially with the intermediate electrode and the discharge electrode, whereby a plasma (discharge gas plasma) in the discharge chamber further effectively converges. A single coil saves costs. The coil permits an electron beam to smoothly pass through the communication hole in the intermediate electrode or the discharge electrode.

The orifices are formed substantially parallel with the surface-to-be-processed, whereby electron beams pulled out through the orifices do no directly impinge on a surface-to-be-processed of a workpiece, and deflection of a plasma density is mitigated by a time that a plasma of a process gas in the plasma processing chamber arrives at a workpiece. Plasma processing on the surface-to-be-processed of the workpiece can be very uniform.

The discharge chamber is formed in the shape of a cylinder projected in the plasma processing chamber in the axial direction, the orifices being formed in a circumferential wall of the cylinder. This simple structure allows a plurality of orifices to be formed substantially perpendicular to the axial line and to be distributed radial to the axial line. Electron beams do not directly impinge on a surface-to-be-processed of a workpiece, and deflection of a plasma density is mitigated by a time that a plasma of a process gas in the plasma processing chamber arrives at a workpiece. Plasma processing on the surface-to-be-processed of the workpiece can be very uniform.

The discharge chamber is formed in the shape of an annular cylinder in the axial direction, which covers an upper outer circumferential wall of the plasma processing chamber, the orifices being formed in an inside circumferential wall of the annular cylinder. This simple structure allows a plurality of orifices to be formed substantially perpendicular to the axial line and to be distributed radial to the axial line. Electrons are permitted to be injected radially to the center of the plasma processing chamber and do not directly impinge on a surface-to-be-processed of a workpiece. Deflection of a plasma density is mitigated by a time that a plasma of a process gas in the plasma processing chamber arrives at a workpiece. Plasma processing on the surface-to-be-processed of the workpiece can be very uniform. The wall of the plasma processing chamber also functions as the accelerating electrode, a second accelerating electrode is opposed to the surface-to-be-processed of the workpiece-to-be-processed, and the orifices formed in the inside circumferential wall of the annular cylinder are positioned between the second accelerating electrode and the surface-to-be-processed. In addition to the accelerating electrode provided by the wall of the plasma processing chamber a second accelerating electrode is provided, and the orifices are located between the second accelerating electrode and the surface-to-be-processed of the workpiece, whereby electron beams flowing out through the orifices flow in a direction opposite to the surface-to-be-processed of the workpiece, so that high-energy components of the electron beams are prohibited from impinging on the surface-to-be-processed of the workpiece, and physical etching on the surface-to-be-processed of the workpiece can be eliminated.

The accelerating electrode is disposed on an inside of the peripheral wall of the plasma processing chamber coaxially with the axial line, whereby a plasma rarer impinges on the inside wall of the plasma processing chamber, and temperature rise of the inside wall of the plasma processing chamber can be depressed. Generation of impurities from the inside wall and contamination of films with the impurities can be prohibited. In this case, it is preferable that the accelerating electrode has a cylindrical shape, a torus shape or a helical shape.

The accelerating electrode includes temperature control means for controlling a temperature thereof. Self-heating, for example, of the accelerating electrode can modify conductive graphite from insulating DLC (Diamond-Like Carbon) staying on the accelerating electrode as a film when methane, for example, is used as a processing gas, and stable discharge can be retained for a long period of time.

The orifices are electrically insulated with respect to the cathode, the intermediate electrode, the discharge electrode and the accelerating electrode. The orifices are insulated from the other electrodes and has a middle potential between a plasma potential and a discharge electrode potential, whereby etching on the orifices is mitigated, and a risk of contamination is reduced with a result of the generator can last longer.

The parts of the partition wall where the orifices are formed are formed of an insulating material. Without special electric insulation provided on the orifices, the orifices can be easily electrically insulated from the other electrodes, which allows the generator to have a simple structure. The insulating material is alumina, aluminium nitride, quartz or their mixture. These materials are relatively easily modable into high-achievenment products, which allows the generator to be economically fabricated.

A multipolar magnetic field generating means is disposed around an outside of the plasma processing chamber. A plasma can be effectively confined inside the plasma processing chamber. Interference of a plasma with the inside wall of the plasma processing chamber can be reduced. Impurities emitted corresponding to temperature rise of the inside wall of the plasma processing chamber can be decreased, and contamiination of the impurites into films can be prevented.

BRIEEF DESCRIPTION OF THE DRAWINGS

The above and other objects, features and advantages of the present invention will become more apparent from the following description taken in connection with the accompanying drawings, in which.

Figure 7:
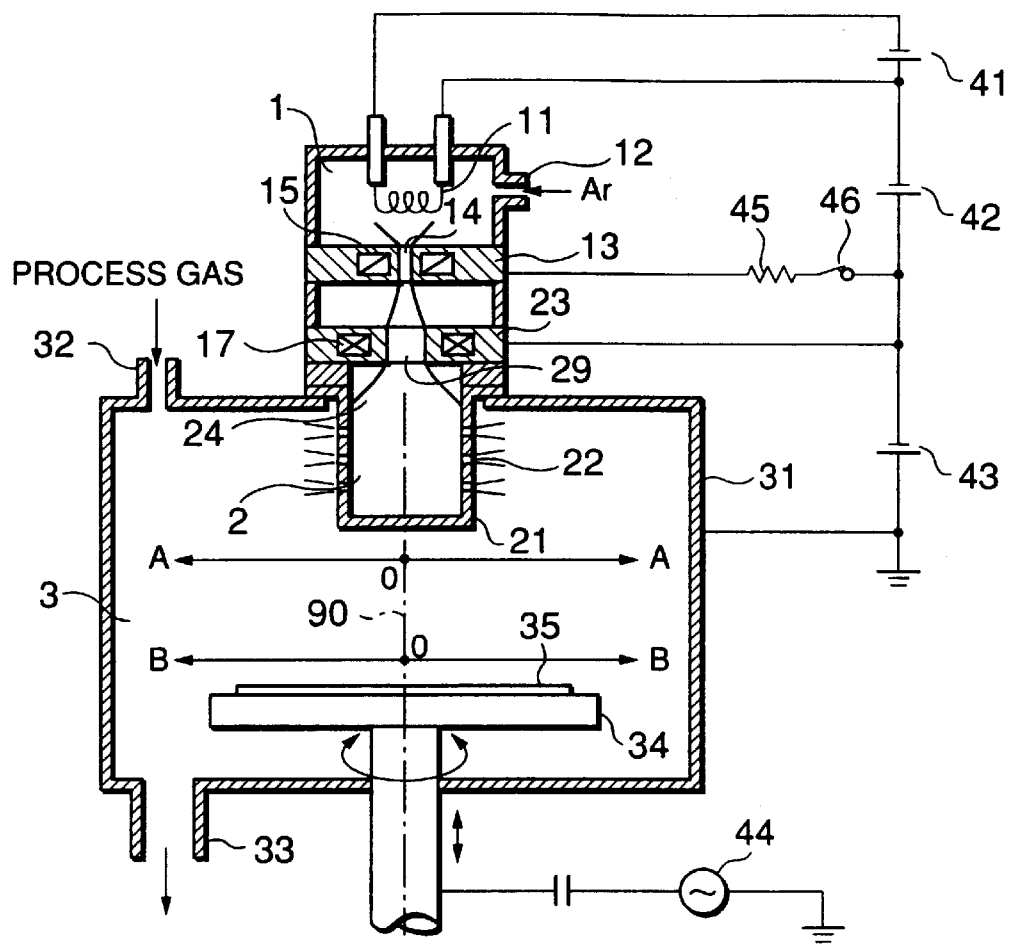
FIG. 7 is a schematic sectional view of an electron-beam excited plasma processing system in a third embodiment according to the present invention.
Figure 11A:
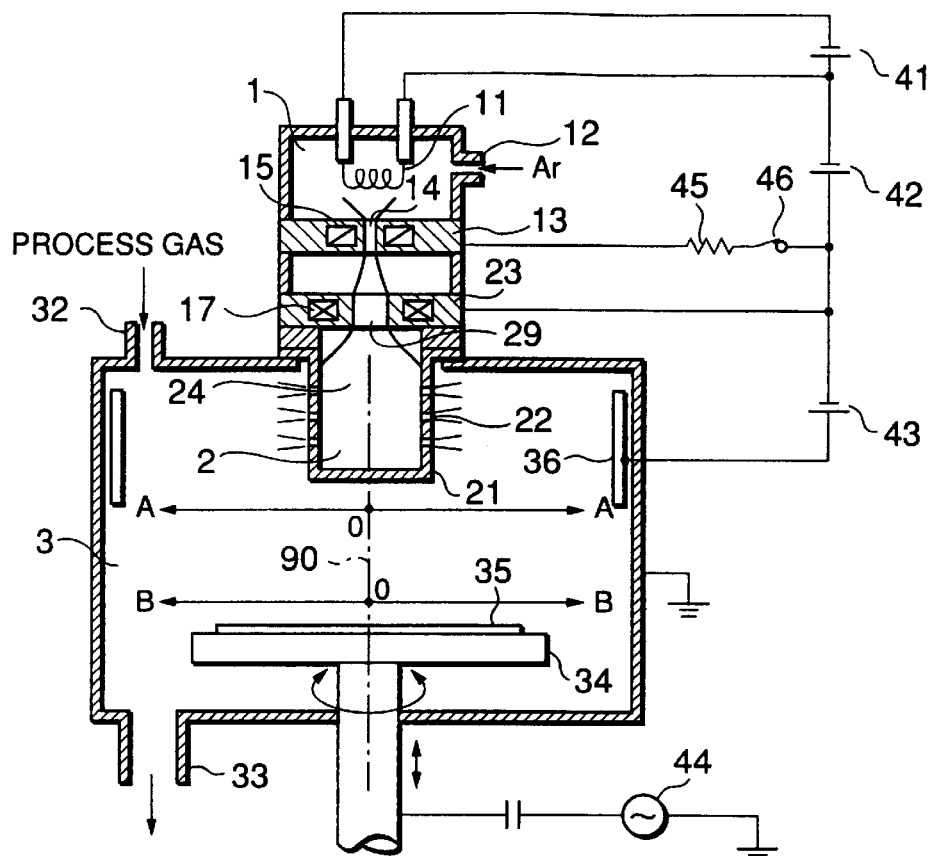
Figure 11B:
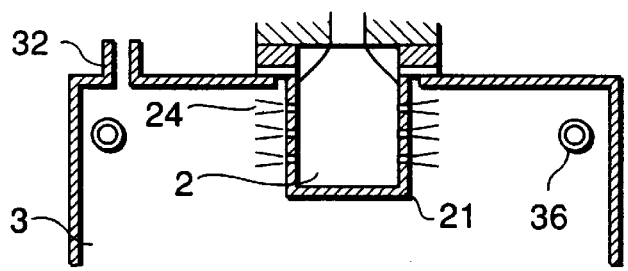
Figure 11C:
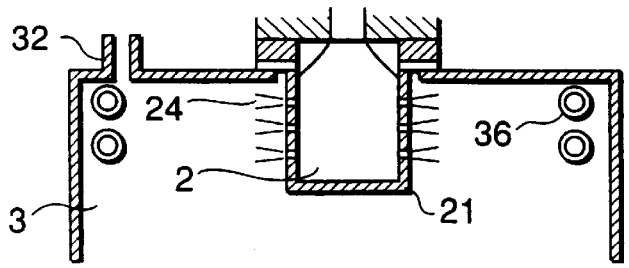
Figure 12A:
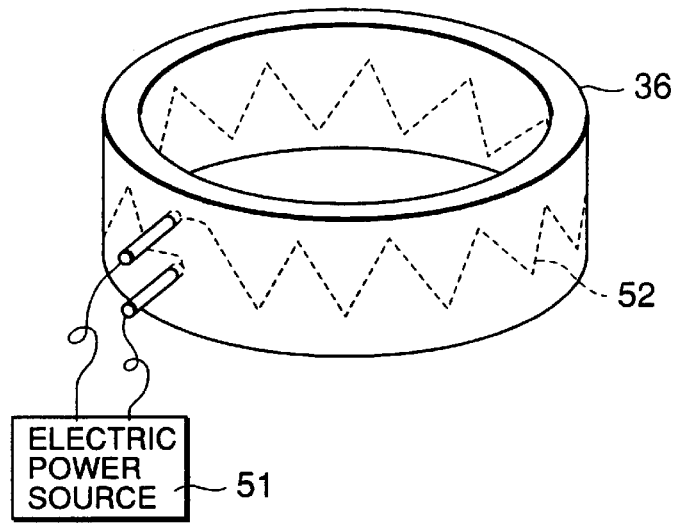
Figure 12B:
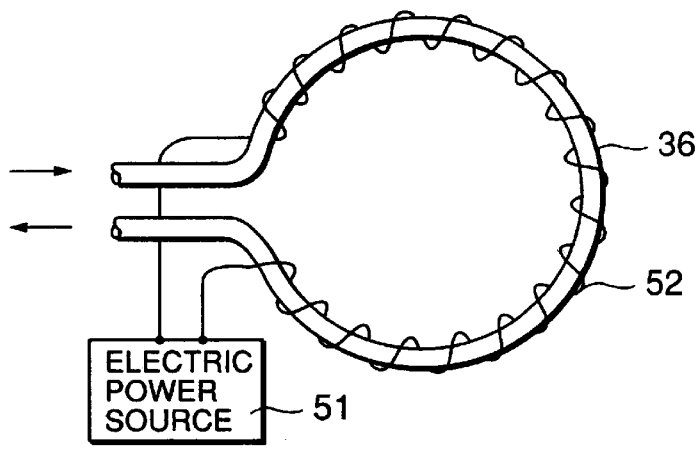
Figure 12C:
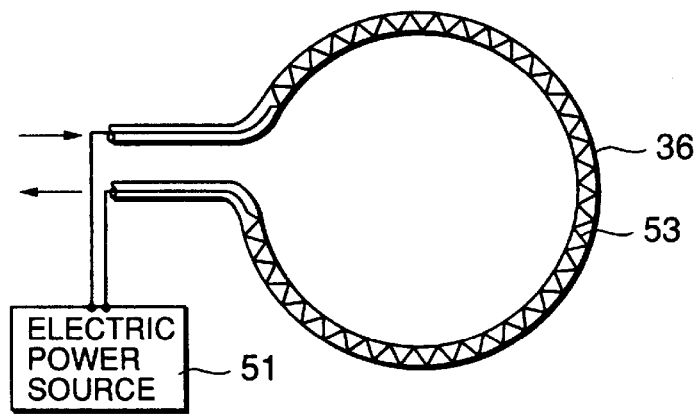
Figure 13:
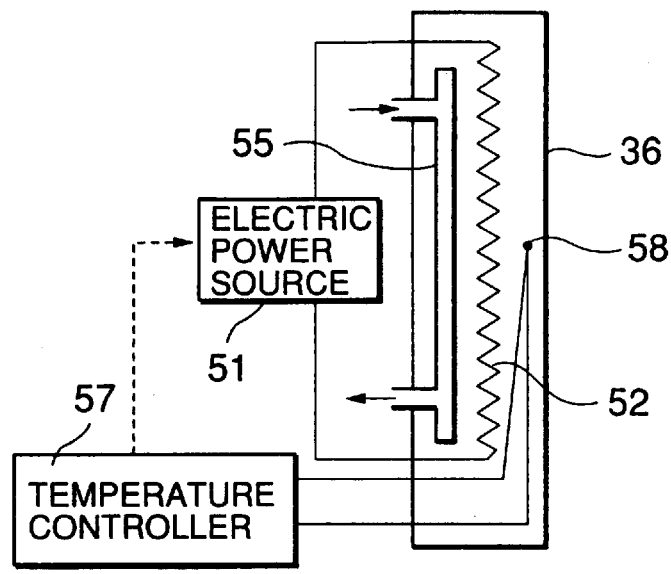
Figure 14:
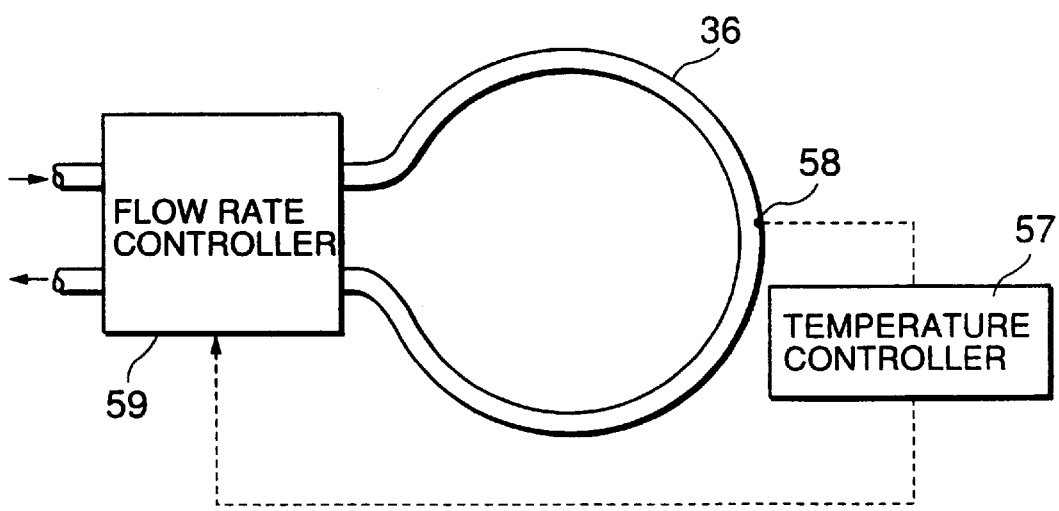
Figure 15:
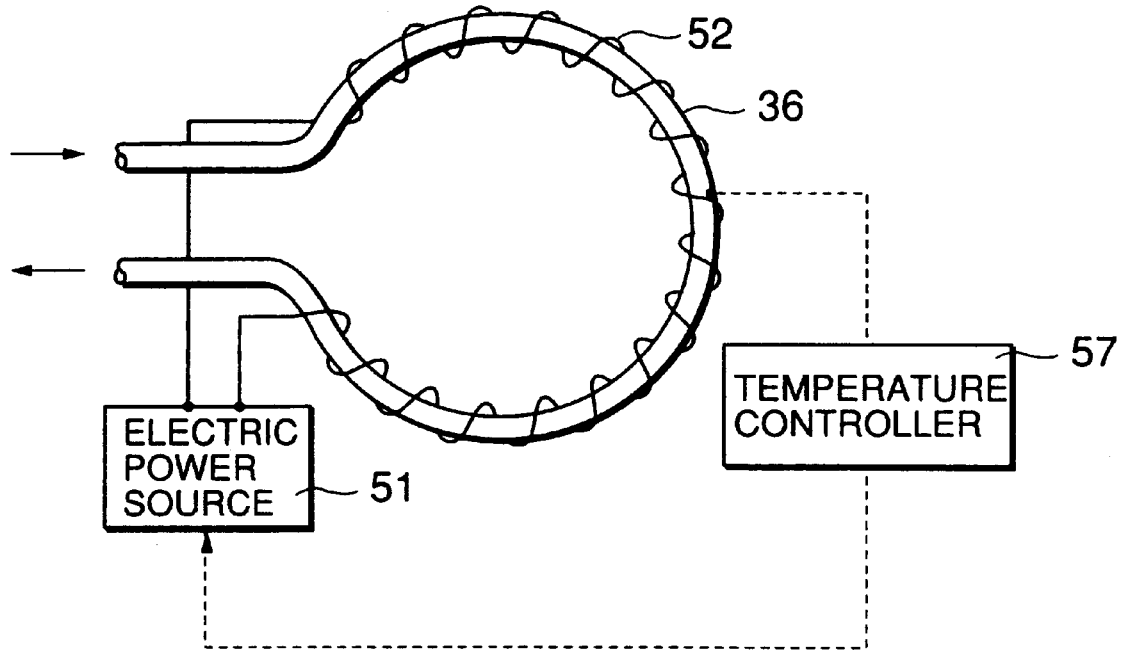
Figure 16:
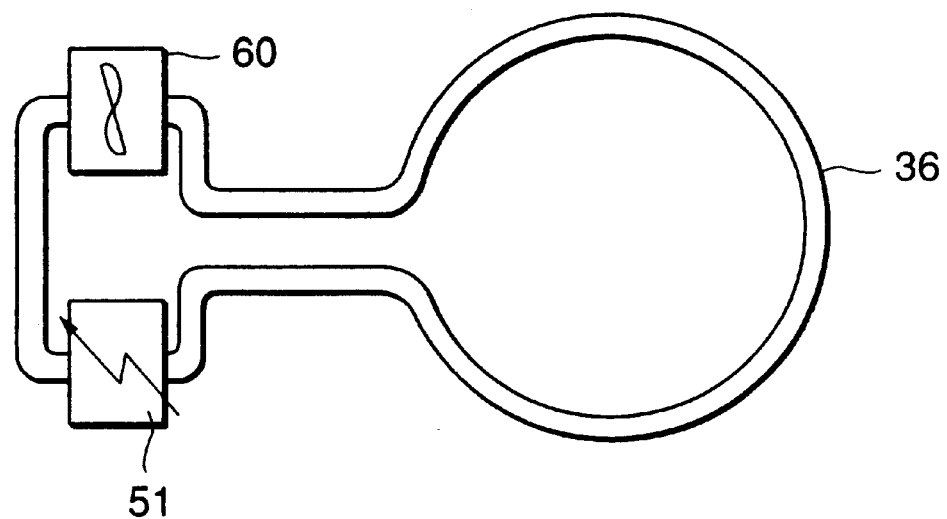
Figure 17:
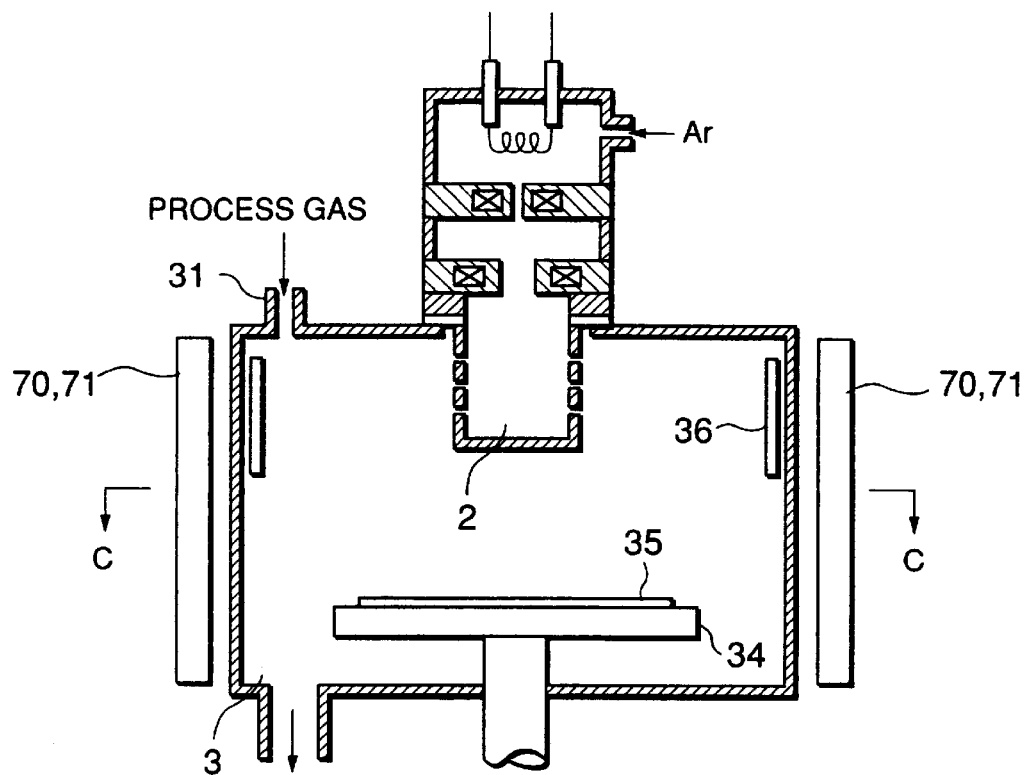
Figure 18:
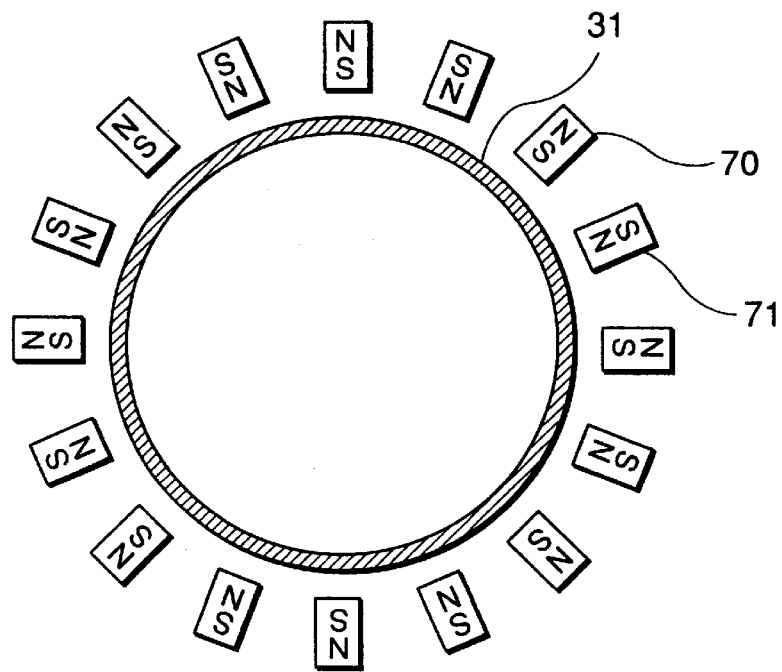
Figure 19:
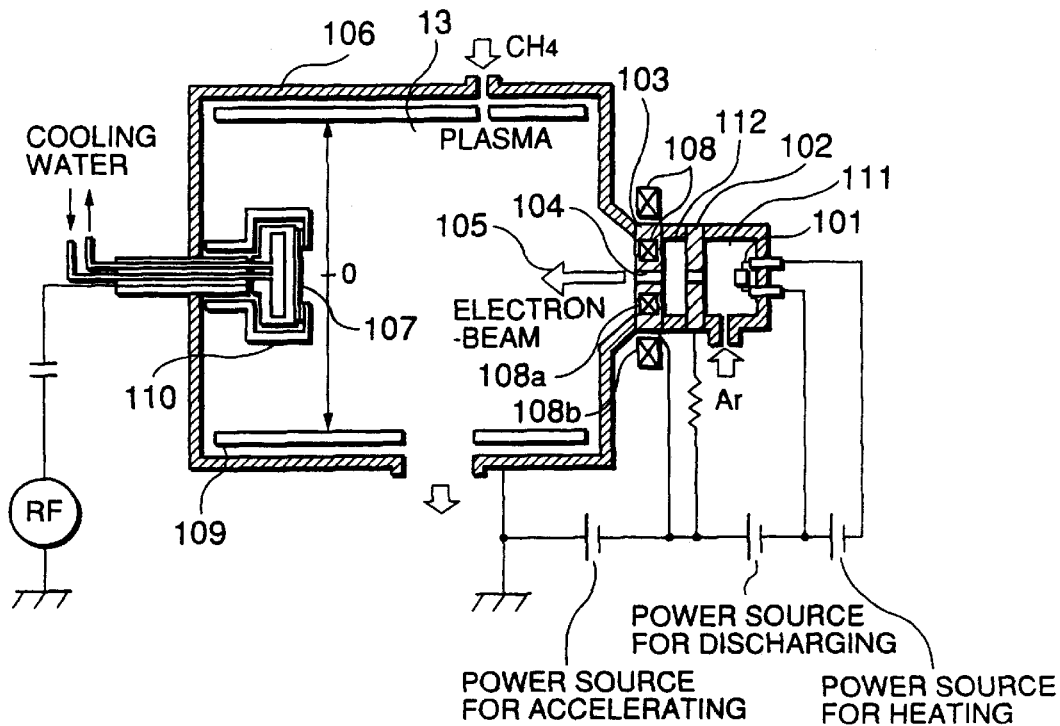
Figures 20A, 20B:
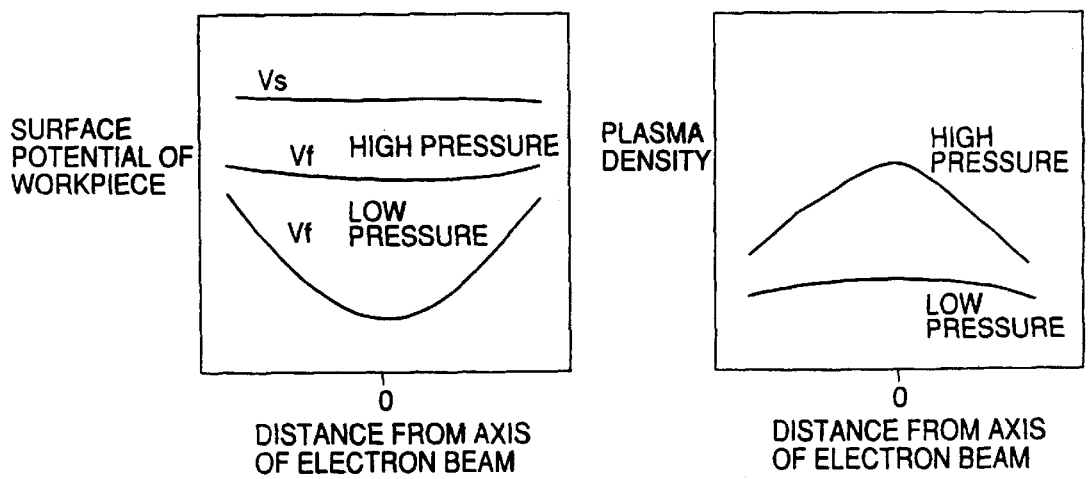
Figure 21:
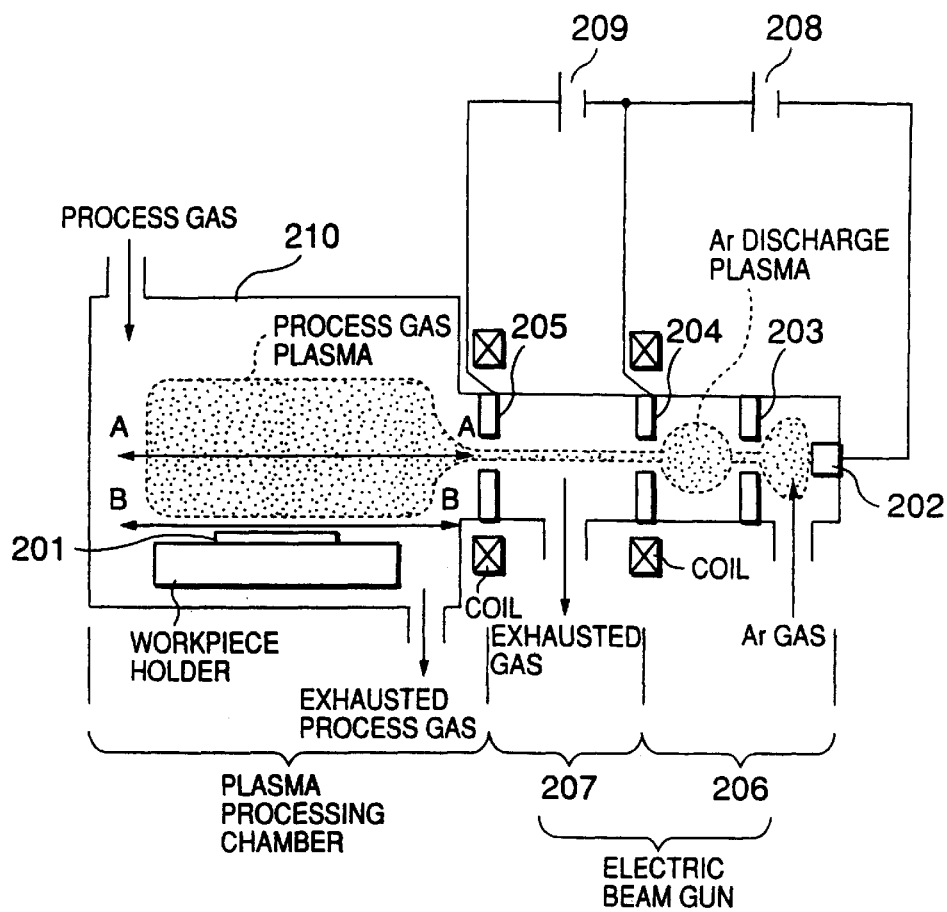
Figures 22A, 22B:
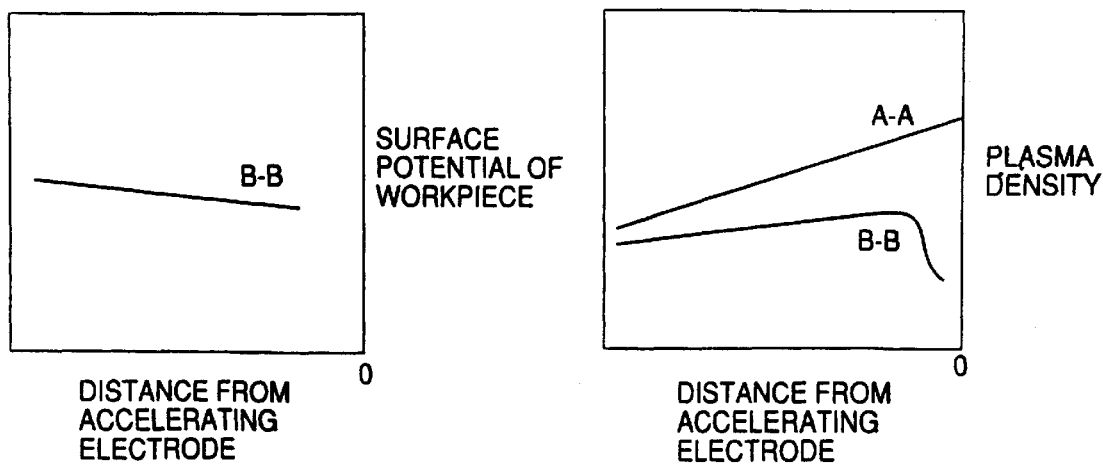

FIGS. 9(a), 9(b) and 9(c) are enlarged, schematic sectional views of modifications of a discharge electrode employed in the electron-beam excited plasma processing system of FIG. 7;

FIGS. 10(a), 10(b) and 10(c) are enlarged, schematic sectional views of further modifications of the discharge electrode employed in the electron-beam excited plasma processing system of FIG. 7;

FIGS. 11(a), 11(b) and 11(c) are schematic sectional views of modifications of an accelerating electrode employed in the electron-beam excited plasma processing system of FIG. 7;

FIGS. 12(a), 12(b) and 12(c) are a perspective view and plan views, respectively, of examples of heating arrangements for heating the accelerating electrode employed in the electron-beam excited plasma processing system of FIG. 11;

FIG. 13 is a block diagram of a temperature regulator which can be incorporated into the accelerating electrode employed in the electron-beam excited plasma processing system of FIG. 11;

FIG. 14 is a block diagram of another temperature regulator which can be incorporated into the accelerating electrode employed in the electron-beam excited plasma processing system of FIG. 11;

FIG. 15 is a block diagram of a thrid temperature regulator which can be incorporated into the accelerating electrode employed in the electron-beam excited plasma processing system of FIG. 11;

FIG. 16 is a block diagram of a heat recovering arrangement for recovering heat from the accelerating electrode employed in the electron-beam excited plasma processing system of FIG. 11;

FIG. 17 is a schematic sectional view of the electron-beam excited plasma processing system of FIG. 11 provided with multipolar electrodes disposed outside the plasma processing chamber of the electron-beam excited plasma processing system FIG. 11 to confine a plasma;

FIG. 18 is a sectional view taken on line C—C in FIG. 17;

FIG. 19 is a typical sectional view of a representative conventional electron-beam excited plasma processing system;

FIGS. 20(a) and 20(b) are graphs respectively showing the distribution of surface potential on a workpiece and the distributions of plasma potential and density in the neighborhood of the surface of the workpiece when the electron-beam excited plasma processing system of FIG. 19 is in operation;

FIG. 21 is a diagrammatic view of an electron-beam excited plasma processing system previously proposed by the inventors of the present invention; and FIGS. 22(a) and 22(b) are graphs showing the distribution of surface potential on a workpiece and the distributions of plasma potential density when the electron-beam excited plasma processing system of FIG. 21 is in operation.

DESCRIPTION OF THE PREFERRED EMBODIMENTS

First Embodiment

Figure 1:
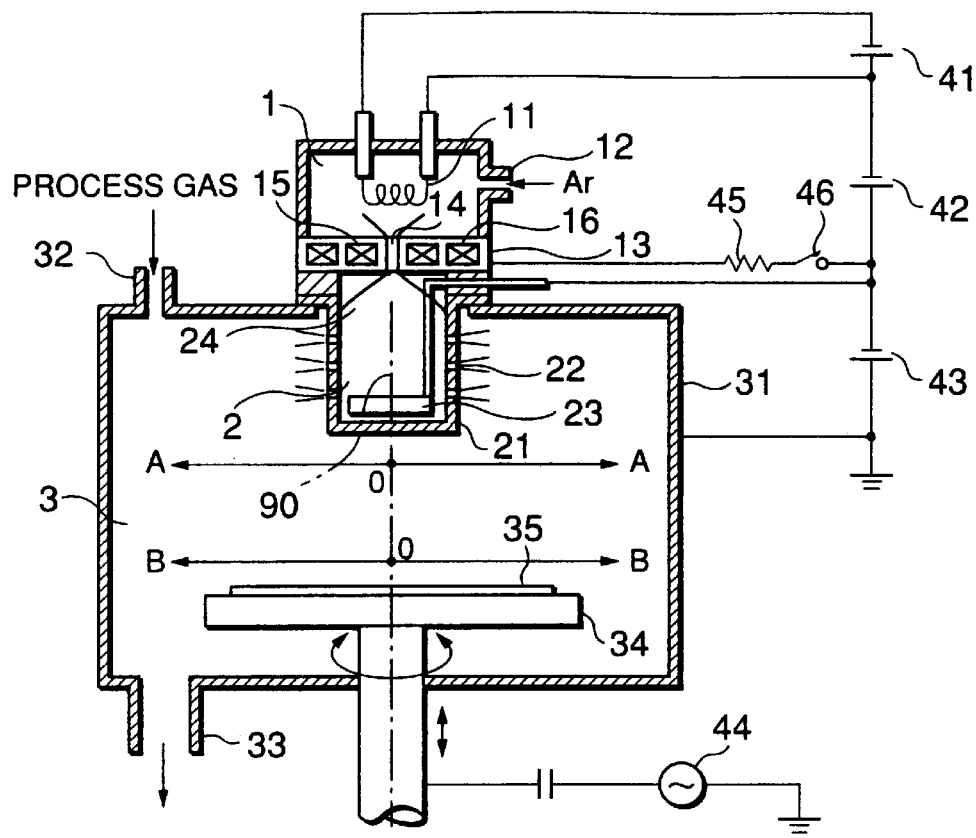
FIG. 1 is schematic sectional view of an electron-beam excited plasma processing system in a first embodiment according to the present invention.

Referring to FIG. 1 showing an elctron-beam excited plasma processing system in a first embodiment according to the present invention, a cathode chamber 1, a discharge chamber 2 and a processing chamber 3 are arranged vertically in that order. The cathode chamber and the discharge chamber 2 are separated from each other by an intermediate electrode 13. A cathode 11 provided with a filamnent which emits thermions is disposed in the cathode chamber 1. An inert gas, such as Ar gas, is supplied through a gas inlet 12 formed in a wall of the cathode chamber 1 into the cathode chamber 1. The intermediate electrode 13 is provided in its central part with an orifice 14 to enable the inert gas and electrons to flow from the cathode chamber 1 into the discharge chamber 2. A pair of coils 15 and 16 are embedded coaxially with the orifice 14 in the intermediate electrode 13.

The discharge chamber 2 is defined by a cylindrical vessel 21 of quartz projecting into the plasma processing chamber 3. The cylindrical side walll of the vessel 21 of quartz is provided with a plurality of orifices 22 through which electron beams are projected into the plasma processing chamber 3. A discharge electrode 23 is disposed opposite to the intermediate electrode 13 in the discharge chamber 2. The intermediate electrode 13 positioned coaxially with the discharge electrode 23 in an axial direction 90. Water-cooling ducts may be combined with the intermediate electrode 13 and the discharge electrode 23 to remove heat generated in those electrodes by an electron beam that flows into those electrodes 23.

A circumferential wall 31 of the plasma processing chamber 3 serves also as an accelerating electrode. The circumferential wall 31 is provided with a gas inlet 32 through which a process gas is supplied into the plasma processing chamber 3, and a gas outlet 33 connected to a vacuum system, not shown. A workpiece holder 34 is disposed opposite to the discharge chamber 2 in the plasma processing chamber 3. The workpiece holder 34 supports a workpiece 35 thereon and is capable of rotation and vertical movement.

An external dc power unit provided with a series circuit of a heating power supply 41, a discharge power supply 42 and an accelerating power supply 43 is connected to the cathode 11, the intermediate electrode 13, the discharge electrode 23 and the accelerating electrode 31 to supply power neceessary for producing a plasma and causing plasma reaction. The heating power supply 41 supplies a heating current to the filamnet of the cathode 11, the discharge power supply 42 applies a discharge voltage across the cathode 11 and the discharge electrode 23, the positive electrode of the accelerating power supply 43 is connected to a ground of a reference potential. The positive electrode of the accelerating power supply 43 is connected to the circumferential wall 31, i.e., the accelating electrode, to apply an accelerating voltage to the circumferential wall 31 to pull out electrons from a plasma produced in the discharge chamber 2. The intermediate electrode 13 is connected through a resistor 45 and a switch 46 to the positive electrode of the discharge power supply 42. A RF power supply 44 is connected to the workpiece holder 34 to apply an appropriate RF bias voltage to the workpiece holder 42 to control ion sheath energy on the surface of the workpiece 35.

Ar gas to be ionized is supplied into the cathode chamber 1. A current is supplied from the heating power supply 41 to the cathode 11 and the cathode 11 emits thermions. When a voltage is applied to the discharge electrode 23 by the discharge power supply 42 while Ar gas is supplied into the cathode chamber 1, initial discharge occurs between the discharge electrode 23 and the intermediate electrode 13, entailing discharge between the cathode 11 and the discharge electrode 23. The diameter of an electron beam flow is reduced while the electrons move through the orifice 14 by the agency of the inner coil 15 embedded in the intermediate electrode 13. A current flowing in a direction opposite a direction in which the current supplied to the inner coil 15 flows is supplied to the outer coil 16 to cancel out a magnetic field on an extension of the axis of the innercoil 15 in order that the field intensity distribution of a magnetic field created in the discharge chamber 2 is moderated and electrons are distributed uniformly in the discharge chamber 2. Consequently, Ar gas flowing from the cathode chamber 1 into the discharge chamber 2 is ionized to fill up the discharge chamber 2 with a plasma 24.

A process gas is supplied through the gas inlet 32 into the plasma processing chamber 3 and is exhausted through the gas outlet 33. The plasma processing chamber 3 is maintained at a fixed pressure during plasma reaction by a pressure regulating system, not shown.

The accelerating power supply 43 applies a voltage across the discharge electrode 23 and the circumferential wall 31 serving as an accelerating electrode to pull out electrons from the plasma 24 produced in the discharge chamber 2 through the orifice 22 into the plasma processing chamber 3. Electrons pulled out from the plasma 24 produced in the discharge chamber 2 into the plasma processing chamber 3 flow in a direction substantially perpendicular to the discharge currents flowing through the discharge chamber 2. The electron currents pulled out from the plasma 24 produced in the discharge chamber 2 dissociate and ionize the process gas supplied into the plasma processing chamber 3 to produce a process gas plasma in the plasma processing chamber 3. Since the cylindrical side wall of the vessel 21 of quartz defining the discharge chamber 2 is provided with the plurality of orifices 22, and the process gas can be dissociated and ionized at a high efficiency because the electron beams projected into the plasma processing chamber 3 contain high-energy electrons in a high ratio, a high-density process gas plasma can be produced in the plasma processing chamber 3. The process gas plasma is used for processing the workpiece 35 mounted on the workpiece holder 34 according to a purpose.

Figure 2:
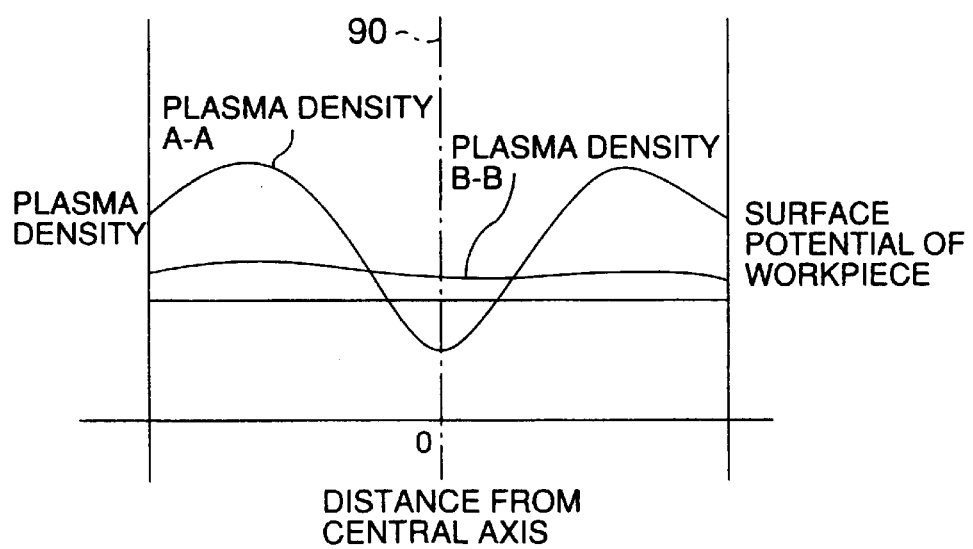
FIG. 2 is a graph of assitance in explaining plasma density distirbution in a processing chamber and surface potential distribution on a workpiece while the electron-beam excited plasma processing system of FIG. 1 is in operation.

FIG. 2 is a graph of assitance in explaining plasma density distirbution in the plasma processing chamber 3 and surface potential distribution on the workpiece 35 while the electron-beam excited plasma processing system is in operation, in which distance along the suface of the workpiece holder 34 from the center O of the workpiece holder 34 is measured on the horizontal axis, and plasma density and surface potential of the workpiece 35 are measured on the vertical axis. As is obvious from FIG. 2, plasma density at a position corresponding to the orifices 22, on a horizontal plane A—A close to the discharge chamber 2 is high, and decreases with distance from the same position, and plasma density assumes an irregular distribution on the horizontal plane A—A. However, the irregularity of plasma density distribution decreases with distance away from the horizontal plane A—A, and plasma density assumes a very flat plasma density distribution on a horizontal plane B—B close to the surface of the workpiece 35. Since the electron currents pulled out from the discharge chamber 2 do not impinge directly on the surface of the workpiece 35, a floating potential distribution curve indicating the distribution of floating potential on the surface of the workpiece 35 is flat and does not have a sunken middle section. Accordingly, a uniform plasma reaction can be achieved over the entire surface of the workpiece 35 even if the workpiece 35 has a large area, and the surface of the workpiece 35 can be processed in a uniform quality.

Figure 3:
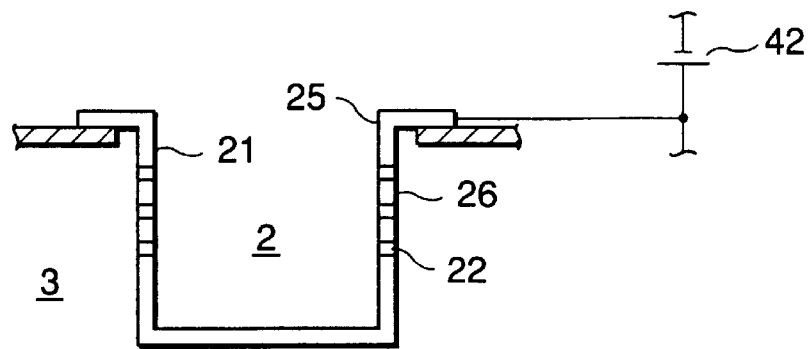
FIG. 3 is an enlarged sectional view of a modification of a wall of a discharge chamber in the electron-beam excited plasma processing system of FIG. 1.
Figure 4:
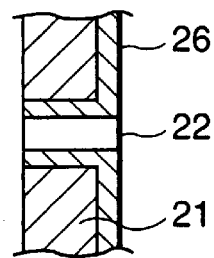
FIG. 4 is an enlarged sectional view of a modification of an orifice in the electron-beam excited plasma processing system of FIG. 1.

Modifications of components of the electron-beam excited plasma processing system in the first embodiment will be described with reference to FIGS. 3 to 5.

The cylindrical vessel 21 of the first embodiment defining the discharge chamber 2 and projecting into the plasma processing chamber 3 is made of insulating quartz glass. The cylindrical vessel 21 shown in FIG. 3 may be provided with a cylindrical body 25 made of a conductive material. In the cylindrical vessel 21 shown in FIG. 3, the cylindrical body 25 is made of a conductive material, the outer surface of the cylindrical body 25 exposed to the plasma processing chamber is coated with an insulating coating 26, a plurality of radial orifices 22 are formed in the cylindrical side wall of the conductive cylindrical body 25, and the conductive cylindrical body is connected to the discharge power supply 42 to use the cylindrical vessel 21 as a discharge electrode. The insulating coating 26 may be formed so as to coat not only the outer surface of the cylindrical body 25 exposed to the plasma processing chamber 3 but also surfaces defining the orifices 22 as shown in FIG. 4 to protect the surfaces defining the orifices 22 from thermal damages which may be caused by the electron beams of a high current, and sputtering by the sputtering action of ions., which cause the contamination of the process.

Figure 5:
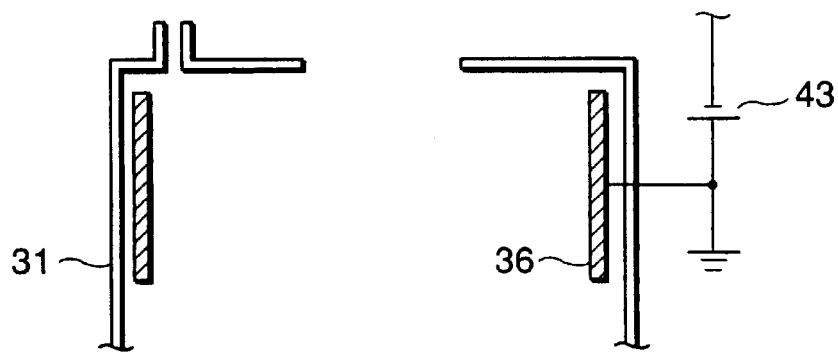
FIG. 5 is an enlarged, schematic sectional view of a mofificatin of a plasma processing chamber in the electron-beam excited plasma processing system of FIG. 1.

As shown in FIG. 5, an accelerating electrode 36 may be disposed in the plasma processing chamber 3 so as to be insulated from the circumferential wall 31. If the accelerating electrode 36 is disposed in the plasma processing chamber 3, electron beams do not impinge directly on the circumferential wall 31 of the plasma processing chamber 3. Therefore the circumferential wall 31 can be held at an appropriate temperature, and the falling of substances deposited on the inner surface of the circumferential wall 31 off the circumferential wall 31 and the mixing of the fallen substances with the plasma can be suppressed.

The cylindrical vessel 21 made of quartz glass and provided with the orifices 22 may be substituted by a cylindrical vessel made of a ceramic material, such as alumina or aluminum nitride, and provided with orifices. The cylindrical vessel made of a ceramic material has high heat resistance, is capable of withstanding heat of a high temperature exerted thereon by the plasma and thermal shock produced therein as a result of undergoing a sudden change in temperature at the start of operation of the electron-beam excited plasma processing system, and enables the production of a process gas plasma of a good quality because the same produces little gases when heated in a high vacuum. Aluminum nitride is a ceramic material having a high thermal conductivity. Therefore, a cylindrical vessel 21 made of aluminum nitride promotes heat removal and is effective in avoiding the deformation of the electron-beam excited plasma processing system and problems due to thermal stress. The cylindrical vessel 21 made of quartz glass is highly resistant to the sputtering action of ions and is least subject to wear.

Second Embodiment

Figure 6:
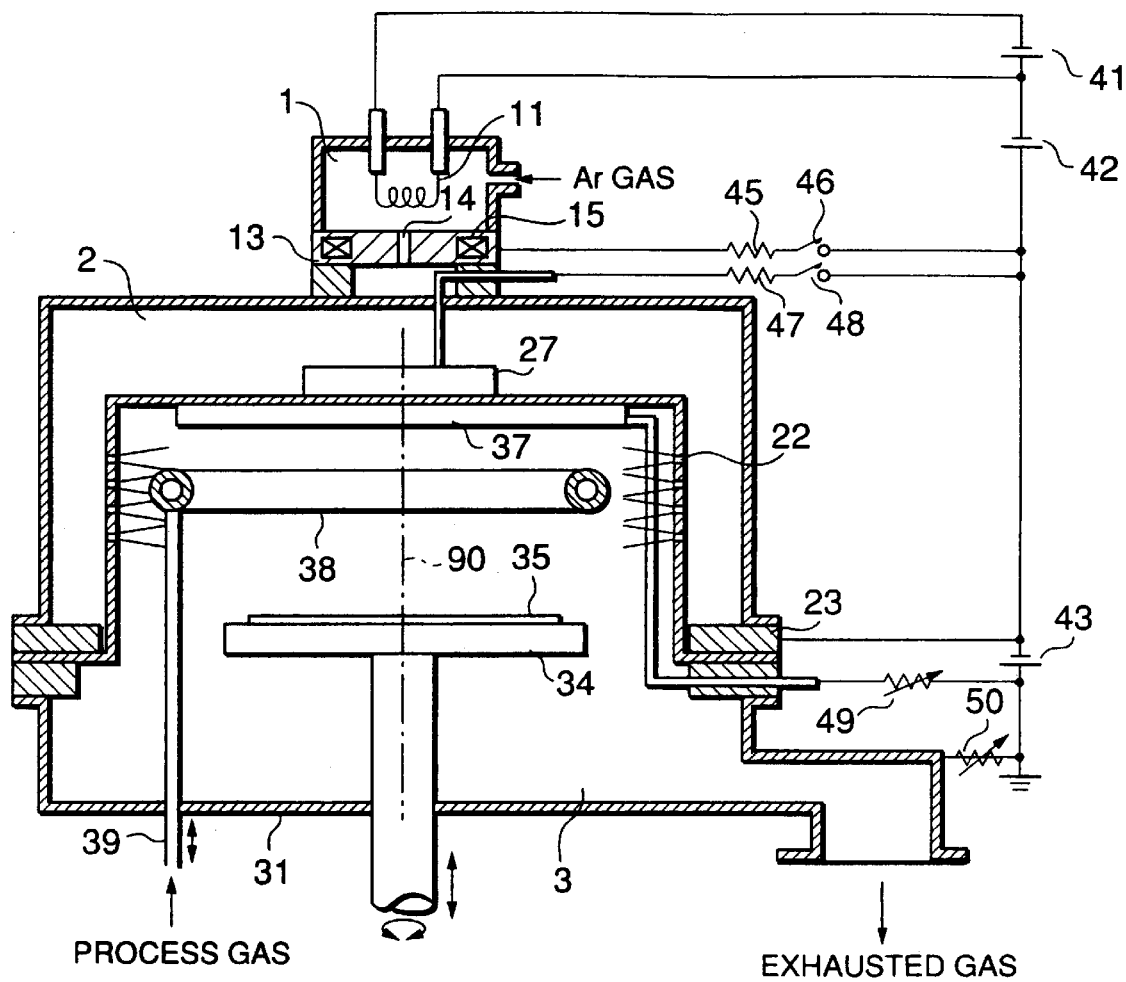
FIG. 6 is a schematic sectional view of an electron-beam excited plasma processing system in a second embodiment according to the present invention.

Referring to FIG. 6 showing an electron-beam excited plasma processing system in a second embodiment according to the present invention, a plasma processing chamber 3 is defined by a double-wall vessel having an outer wall and an inner wall. A discharge chamber 2 is defined by the outer and the inner wall of the double-wall vessel. The side section of the inner wall is provided with a plurality of orifices 22. Electrons produced in the discharge chamber 2 are jetted through the orifices 22 radially inward toward the central region of the plasma processing chamber 3. The functions of the electron-beam excited plasma processing system in the second embodiment are the same as those of the electron-beam excited plasma processing system in the first embodiment. In FIG. 6, parts like or corresponding to those shown in FIG. 1 are designated by the same reference characters to facilitate understanding.

In the electron-beam excited plasma processing system in the second embodiment, a structure defining the discharge chamber 2 connected to a cathode chamber 1 has the shape of a double-wall bell jar. The discharge chamber 2 surrounds an upper half section of the plasma processing chamber 3.

An intermediate electrode 13 separates the cathode chamber 1 and the discharge chamber 2 from each other, and is provided with an orifice 14 and one or a pair of coils embedded therein and coaxial with the orifice 14. An annular discharge electrode 23 is disposed at the lower end of the discharge chamber 2. An auxiliary electrode 27 is disposed on an extension of the axis of the orifice 14 of the intermediate electrode 13. The inner wall of the structure defining the discharge chamber 2 is provided with a plurality of radial orifices 22 of a large diameter.

A workpiece holder 34 is disposed in the plasma processing chamber 3. The workpiece holder 34 supports a workpiece 35 thereon with the surface of the workpiece 35 extended in parallel to directions in which electrons are pulled out through the orifices 22 and is capable of rotation and vertical movement. A wall 31 defining a lower half section of the plasma processing chamber 3 serves also as a first accelerating electrode. A second accelerating electrode 37 is disposed on the inner surface of an upper section of the inner wall of the structure defining the discharge chamber 2. A tubular gas shower ring 38 is disposed on the same level as the orifices 22. The gas shower ring 38 is provided with a plurality of gas jetting holes opening in raidally outward directions. A process gas supply pipe 39 is connected to the gas shower ring 38. The process gas supply pipe 39 can be vertically moved to adjust the vertical position of the gas shower ring 38.

A heating power supply 41 supplies a heating current to the filament of the cathode 11, a negative electrode of a discharge power supply 42 is connected to the cathode 11, and the positive electrode of the same is connected to the discharge electrode 23. The intermediate electrode 13 is connected by a series circuit of a resistor 45 and a switch 46 to the positive electrode of the discharge power supply 42, and the auxiliary electrode 27 is connected by a series circuit of a resistor 47 and a switch 48 to the positive electrode of the discharge power supply 42. A grounded positive electrode of an accelerating power supply 43 is connected through variable resistors 49 and 50 to the second accelerating electrode 37 and the wall 31 serving as the first accelerating electrode, respectively.

Although not shown, a workpiece holder 34 is connected to high-frequency electric power means.

When current from the heating power supply 41 is supplied to the cathode 11, thermions are emitted to the surroundings. Further when an inert gas is fed into the cathode chamber 1, discharge takes place between the cathode 11 and the auxiliary electrode 27 through an initial discharge generated between the cathode 11 and the intermediate electrode 13 by the discharge electric power source 42. Here when the auxiliary electrode 27 is disconnected from the discharge power supply 42, a plasma is generated up to the discharge electrode 23, and the plasma is stably present from the cathode 11 to the discharge electrode 23. The electrons pass through the orifice 14 in a flow which is made sufficiently confined by action of coil 15 mounted in the intermediate electrode 13. In a case that a pair of coils 15, 16 is used, a plasma fully fills the discharge chamber 2 to mitigate a magnetic field distribution in the discharge chamber 2.

Here, with a voltage from the accelerating power supply 43 applied to the accelerating electrode 31 and the second accelerating electrode 37, a large current of electron beam is pulled out from the plasma through the orifices 22 and flows into the plasma processing chamber 3. Electron beams are directed from the periphery of the plasma processing chamber 3 to the center thereof.

On the other hand, the process gas to be introduced into the plasma processing chamber 3 is passed through the gas injection holes of the gas shower ring 38 to be injected into the electron beams entering at the periphery of the plasma processing chamber 3 and plasmatized. Because the gas injection holes of the gas shower ring 38 are opened toward the circumferential wall of the plasma processing chamber 3, and the gasis fed to the vicinity of the orifices 22, where the energy of electron beam is high, whereby a high plasma density can be obtained, and a relatively even spatial distribution can be obtained.

The plasma of the process gas reacts with the surface of a workpiece 35 on the workpiece holder 34 to form a product. In the present embodiment, because the electron beams are directed substantially parallelly with the surface of the workpiece, high-energy beam components of the electron beams are kept from impinging directly on the surface to disturb a floating potential distribution on the surface, and a plasma density is even near the workpiece surface, whereby workpieces of even large areas lead to homogeneous products.

The second accelerating electrode 37 is disposed on the ceiling of the plasma processing chamber 3, opposed to the mounted side of the workpiece holder 34. Because the track of the electron beams pulled out through the orifices 22 are restricted between the second accelerating electrode 37 and the workpiece holder 34, the electron beams which have been pulled out through the orifices 22 can be prohibited from directing to the surface of the workpiece 35.

A variable resistor 50 connected to the accelerating electrode 31, and a variable resistor 49 connected to the second accelerating electrode 37 are adjusted to change a ratio of accelerated electrons flowing into the accelerating electrode 31 on the inside bottom of the plasma processing chamber 3 and those flowing into the second accelerating electrode 37 to thereby control a shape of the plasma.

Furthermore, a height of the gas shower ring 38 is changed to thereby adjust a degree of electrolytic dissociation of the gas, whereby film deposition can be performed under optimum conditions.

A shape and a number of the gas shower ring 38, and a number and a direction of the gas injection holes can be optimumly selected in accordance with a required plasma density distribution.

A height of the workpiece holder 34 is adjusted to adjust a plasma density and a plasma density distribution, which act on a workpiece 35. The workpiece holder 34 is rotated to cause uniform reactions even when a plasma density distribution is not uniform.

In FIG. 6, the injection direction of the electron beams from the discharge chamber 2 are substantially horizontal, but needless to say it suffices that the electron beams have a suitable angle to the surface of a workpiece 35. Accordingly it is not essential that the inside wall of the discharge chamber 2 is vertical.

The auxiliary electrode 27 opposed to the intermediate electrode 13 is a disc-shaped electrode but may be a ring-shaped electrode which is coaxial with the intermediate electrode 13 to thereby admit the electrons to pass through the ring.

In place of forming the discharge electrode 23 in a disc shape, it is possible that the discharge electrode 23 is divided in a plurality of sectorial electrodes which are connected to the anode side of the discharge power supply 42 via respective adjustable resistors. By dividing the discharge electrode 23 into a plurality of sectional electrodes, it is possible to form a uniform discharge and, as a result, to make an electron-beam flux pulled out through each of the orifices uniform.

[A Third Embodiment]

FIG. 7 is a view explanatory of a principle of a third embodiment of the present invention.

The present embodiment is different from the first embodiment in that in the former a discharge electrode 23 is located at a different position to change the order of the arrangement of the discharge unit. Different parts alone of the present embodiment from the first embodiment will be explained.

In FIG. 7, members of the present embodiment having the same functions as those of the first embodiment shown in FIG. 1 are represented by the same reference numbers not to repeat the explanation.

Members except the discharge electrode 23 are located at substantially the same positions as those of the first embodiment, and the discharge electrode 23 is located right below an intermediate electrode 13 and on a discharge chamber 2.

An inert gas, Ar is plasmatized by applying a voltage between a cathode 11 and a discharge electrode 23. A ring coil 17 is buried in the discharge electrode 23. A a most part of the electron beam which has passed through an orifice 14 does not flow onto the discharge electrode 23 directly but flows into the discharge chamber 2 through a communication hole 29 of the discharge electrode 23 and flows into the discharge electrode 23 after the plasma 24 is produced.

Figure 8:
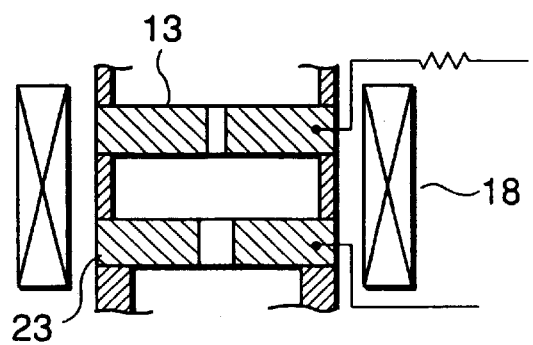
FIG. 8 is an enlarged, schematic sectional view of an coil employed in the electron-beam excited plasma processing system of FIG. 7.

In place of burying the coils respectively in the intermediate electrode 13 and the discharge electrode 23, as expanded in FIG. 8, a single larger-radius coil 18 may be disposed coaxially with both electrodes in a region containing both electrodes, whereby the same effect can be produced. The coil is thus disposed outside the electrodes, whereby free design and easier fabrication are made possible in comparison with burying the coils in the electrodes.

FIGS. 9 and 10 show modifications of the discharge electrode 23 of the present embodiment.

In the modifications shown in FIG. 9 the surface of the discharge electrode 23 on the side of the intermediate electrode 13 is covered with an insulation plate 28 (FIG. 9(*a*)), whereby more current can flow through the communication hole 29 in the discharge electrode 23, and the electron beam in the discharge chamber 2 can have higher density. The plasma 24 can have accordingly higher density, and a larger number of electrons can be fed into the plasma processing chamber 3. As shown in FIG. 9(*b*) or FIG. 9(*c*), even the inside of the communication hole 29 in the discharge electrode 23 may be covered with the insulation plate 28.

In the modification shown in FIG. 10(*a*) the surface of the discharge electrode 23 on the side of the discharge chamber 2 is covered with the insulation plate 28. Because of the insulation plate 28, the inside of the discharge electrode 23 is less susceptible of spattering by the ions, and less metal particles are spattered, whereby contamination is reduced. As shown in FIG. 10(*b*) or FIG. 10(*c*), even the inside of the communication hole 29 in the discharge electrode may be covered with the insulation plate 28.

Any of the modifications shown in FIGS. 9(*a*), 9(*b*) and 9(*c*), and any of those shown in FIGS. 10(*a*), (*b*) and (*c*) may be combined with each other.

FIGS. 11(a), 11(b) and 11(c) show modifications of the present embodiment.

The modification shown in FIG. 11(a) is different from the present embodiment in that in the former the cylindrical electrode 36 disposed in the plasma processing chamber 3 is used as an accelerating electrode, and different parts alone of the modification from the present embodiment will be explained. In FIG. 11(a) members of the modification having the same functions as the third embodiment shown in FIG. 7 are represented by the same reference numbers not to repeat the explanation.

The cylindrical accelerating electrode 36 is disposed in a plasma processing chamber 3 and is connected to the accelerating power supply 43, insulated with respect to the inside wall of the plasma processing chamber 3. Accordingly little plasma enters the wall of the plasma processing chamber 3, and the wall have little temperature rise. A temperature of the wall can be easily controlled. Generation of impurities from the wall can be depressed, and contamination of workpiece surfaces with the impurities can be depressed.

In a case that methane is fed as a processing gas, DLC (Diamond Like Carbon) film is produced on workpiece surfaces, the electrodes, etc., and the DLC film stays on the accelerating electrode 36, because of insulation of the DLC film stable discharge and acceleration of the electron beams cannot be retained for a long period of time. As a countermeasure to this, the accelerating electrode 36 itself is self-heated to above 400° C. in operation to change the insulating DLC film staying on the accelerating electrode 36 to conductive graphite, whereby good conductivity is always ensured to retain stable discharge and acceleration for a long period of time.

The accelerating electrode 36 may be in the form of a torus as shown in FIG. 11 (b) or a helix as shown in FIG. 11(c) of a pipe of a heat-resistant material. such as stainless steel, molybdenum or others. In these cases, more preferably a heat-medium circulation pipe is connected to the hollow part of the pipe to control an electrode surface temperature by a flow rate and a temperature of a heat medium, such as silicone oil or nitrogen gas.

FIG. 12(a) shows the cylindrical accelerating electrode 36 shown in FIG. 11(a). FIGS. 12(b) and 12(c) show modifications of the accelerating electrode 36 each in the form of a pipe with an electric heater 51 added thereto for easier temperature control.

FIG. 12(a) is a perspective view of the cylindrical accelerating electrode 36 with a heater 53 incorporated therein for temperature control by an electric power source 51. The modification shown in FIG. 12(b) includes the pipe-shaped heating electrode 36 and a sheath heater 52 wound on the outer surface thereof for temperature control by the electric power source 51. The modification shown in FIG. 12(c) includes the pipe-shaped heating electrode 36 with the heater 53 incorporated in the pipe.

The self-heating accelerating electrode 36 is effective in a case that a flow of electrons from a plasma to the accelerating electrode 36 is insufficient because of low plasma density for sufficient temperature rise.

FIGS. 13 to 16 show the accelerating electrode 36 for administering temperatures by a temperature control system.

FIG. 13 is a conceptual view of the cylindrical accelerating electrode 36 including the heater 52, a jacket 55 and a temperature detection terminal 58 buried in. The heater 52 is connected to the electric power source 51 which can control an output in response to an external signal. The temperature detecting terminal 58 in the form of a thermo couple, a temperature resistor or others inputs a measured signal to a temperature controller 57, and based on a measured temperature, the temperature controller 57 controls an output of the electric power source 51.

When the accelerating electrode 36 is heated, the surface thereof is evaporated to contaminate a film being deposited and degrade its quality. A temperature should not be unnecessarily raised. A heat medium, such as silicone oil or others, or cooling water may be flowed in the jacket 55 to cool the accelerating electrode 36 when overheated.

FIG. 14 shows a system for temperature control of the accelerating electrode 36, which comprises the temperature detection terminal 58 for measuring a temperature of the pipe-shaped accelerating electrode 36 and which controls a flow rate of the heat medium flowing through the accelerating electrode 36 when the temperature controller 57 supplies a control signal to flow rate control means 59 in response to a measured signal from the temperature detection terminal 58. The flow rate control means 59 is in a form of various control valves.

The temperature detection terminal 58 may be a thermo couple, a resistor-type temperature detecting means or others and can be disposed inside the pipe of the accelerating electrode 36.

FIG. 15 shows a system which comprises the sheath heater 52 wound on the outer surface of the heating electrode 36, and the heating power source 51 connected to the sheath heater 52, which can control an output in response to an external signal.

In a case that an electric heater is disposed in the pipe of the accelerating electrode 36 the same temperature control is possible.

FIG. 16 is a view of a system for utilizing surplus heat when the accelerating electrode 36 is over-heated.

A heat medium, such as nitrogen gas, silicone oil or others, is circulated in the pipe of the torus-shaped heating electrode 36. A medium circulating mechanism 60 is used in the form of a fan for circulating a gas heat medium and in the form of a pump for circulating a liquid heat medium. Heat received by the accelerating electrode 36 is heat-exchanged with an outside thermal shock source through a heat-exchanger 61 to be reused effectively for another application.

FIGS. 17 and 18 are sectional views of the generator including a multipolar magnetic field generating mechanism disposed outside the plasma processing chamber 3 for confining plasma. FIG. 17 is a side sectional view, and FIG. 18 is a sectional view along the line C—C in FIG. 17.

A number of permanent magnets or electromagnets 70, 71 are disposed around the plasma processing chamber 3. The magnets 70, 71 have a vertically elongate shape and are arranged with the magnetic poles directed toward the plasma processing chamber 3 and alternately arranged. A multipolar magnetic field is thus formed.

The thus-formed multipolar magnetic field effectively confines inside a plasma formed in the plasma processing chamber 3, and interference with the circumferential wall 31 is reduced. Accordingly, because the circumferential wall 31 has a small temperature rise due to plasma particles flowing in, little impurity is emitted from the circumferential wall 31. Contamination of films with impurities is reduced, and products of good quality can be obtained.

In the above-described embodiments, a workpiece surface is faced upward but may be faced downward or sideward, needless to say, with no change to the effects of the invention. For confining plasma the multipolar magnetic field generating means may be disposed around or inside the plasma processing chamber 3. For homogeneous deposition it is effective to provide a mechanism for rotating a substrate.

As detailed above, the electron-beam excited plasma generator according to the present invention can mitigate affection due to ion impingement to thereby form workpieces of large areas, and can increase material plasma density and improve deposition homegeneity to thereby effectively form workpieces.

What is claimed is:

1. An electron-beam excited plasma generator comprising:
    a cathode for emitting thermions;
    a discharge electrode for gas discharge between the cathode and the discharge electrode;
    an intermediate electrode coaxial with the discharge electrode in an axial direction;
    a discharge chamber to be filled with discharge gas plasma generated by the gas discharge between the cathode and the discharge electrode;
    a plasma processing chamber formed adjacent to the discharge chamber with a partition wall disposed therebetween and positioned so that a surface-to-be-processed of a workpiece-to-be-processed is positioned perpendicular to the axial direction;
    a plurality of orifices for pulling out electrons in the discharge gas plasma in the discharge chamber into the plasma processing chamber, each being formed in the partition wall substantially perpendicular to the axial direction and distributed radially with respect to the axial direction; and
    an accelerating electrode disposed in the plasma processing chamber for pulling out and accelerating the electrons through the orifices.

2. An electron-beam excited plasma generator according to claim 1, wherein the partition wall is formed of a conductor and also functions as the discharge electrode.

3. An electron-beam excited plasma generator according to claim 2, wherein surfaces of the pull-out orifices on the side of the plasma processing chamber are coated with an insulating material.

4. An electron-beam excited plasma generator according to claim 2, wherein surfaces of the orifices are coated with an insulating material.

5. An electron-beam excited plasma generator according to claim 1, wherein the discharge chamber is formed between the intermediate electrode and the discharge electrode.

6. An electron-beam excited plasma generator according to claim 1, wherein the discharge chamber is formed below both the intermediate electrode and the discharge electrode.

7. An electron-beam excited plasma generator according to claim 6, wherein a surface of the discharge electrode on the side of the intermediate electrode is coated with an insulating material.

8. An electron-beam excited plasma generator according to claim 6, wherein a surface of the discharge electrode on the side of the orifices is coated with an insulating material.

9. An electron-beam excited plasma generator according to claim 1, wherein a wall of the plasma processing chamber also functions as the accelerating electrode.

10. An electron-beam excited plasma generator according to claim 1, wherein a single coil for generating a magnetic field is disposed coaxially with the intermediate electrode and the discharge electrode.

11. An electron-beam excited plasma generator according to claim 1, wherein the orifices are formed substantially parallel with the surface-to-be-processed.

12. An electron-beam excited plasma generator according to claim 1, wherein the discharge chamber is formed in the shape of a cylinder projected in the plasma processing chamber in the axial direction, the orifices being formed in a circumferential wall of the cylinder.

13. An electron-beam excited plasma generator according to claim 1, wherein the discharge chamber is formed in the shape of an annular cylinder in the axial direction, which covers an upper outer circumferential wall of the plasma processing chamber, the orifices being formed in an inside circumferential wall of the annular cylinder.

14. An electron-beam excited plasma generator according to claim 13, wherein the wall of the plasma processing chamber also functions as the accelerating electrode, a second accelerating electrode is opposed to the surface-to-be-processed of the workpiece-to-be-processed, and the orifices formed in the inside circumferential wall of the annular cylinder are positioned between the second accelerating electrode and the surface-to-be-processed.

15. An electron-beam excited plasma generator according to claim 1, wherein the accelerating electrode is disposed on an inside of the peripheral wall of the plasma processing chamber coaxially with the axial line.

16. An electron-beam excited plasma generator according to claim 15, wherein the accelerating electrode has a cylindrical shape, a torus shape or a helical shape.

17. An electron-beam excited plasma generator according to claim 1, wherein the accelerating electrode includes temperature control means for controlling a temperature thereof.

18. An electron-beam excited plasma generator according to claim 1, wherein the orifices are electrically insulated with respect to the cathode, the intermediate electrode, the discharge electrode and the accelerating electrode.

19. An electron-beam excited plasma generator according to claim 1, wherein
    parts of the partition wall where the orifices are formed are formed of an insulating material.

20. An electron-beam excited plasma generator according to claim 19, wherein the insulating material is alumina, aluminium nitride, quartz or their mixture.

21. An electron-beam excited plasma generator according to claim 1, wherein a multipolar magnetic field generating means is disposed around an outside of the plasma processing chamber.

* * * * *